United States Patent [19]

Matsuda

[11] Patent Number: 5,659,737
[45] Date of Patent: Aug. 19, 1997

[54] METHODS AND APPARATUS FOR DATA COMPRESSION THAT PRESERVES ORDER BY USING FAILURE GREATER THAN AND FAILURE LESS THAN TOKENS

[75] Inventor: Yasuhiro Matsuda, Redwood Shores, Calif.

[73] Assignee: Oracle Corporation, Redwood Shores, Calif.

[21] Appl. No.: 509,764

[22] Filed: Aug. 1, 1995

[51] Int. Cl.$^6$ .............................. G06F 5/00; G06F 17/30
[52] U.S. Cl. ............................. 395/612; 395/607; 341/90
[58] Field of Search ................................... 395/607, 612, 395/615; 341/50, 90

[56] References Cited

U.S. PATENT DOCUMENTS

| | | | |
|---|---|---|---|
| 5,001,477 | 3/1991 | Hicks et al. | 341/50 |
| 5,270,712 | 12/1993 | Iyer et al. | 341/50 |
| 5,546,080 | 8/1996 | Langdon, Jr. et al. | 341/107 |
| 5,585,793 | 12/1996 | Antoshenkov et al. | 341/51 |

OTHER PUBLICATIONS

Predictive Text Compression By Hashing, By T. Raita and J. Teuhola, Proceedings of the 10th Annual ACM SIGIR Conference on Research Development in Information Retrieval, New Orleans, Jun. 3–5, 1987, pp. 223–232.

*Primary Examiner*—John C. Loomis
*Attorney, Agent, or Firm*—Fliesler, Dubb, Meyer & Lovejoy

[57] ABSTRACT

A compressor receives a plurality of characters in a character string, and encodes the input character string to generate an encoded string. The encoding preserves the original binary order of the input character strings in the encoded strings. A predicted character is generated for each character based on prior character sequences in the character string. In one embodiment, a hash based predictive technique is used to generate the predicted characters. A correct order indicating token is generated for an input character if a predicted character, corresponding to the input character, is the input character. The compressor stores the order indicating token in the encoded string to represent the character. However, if an input character has a binary representation greater than a binary representation of a corresponding predicted character, then a failure greater than token and the input character are stored in the encoded string to represent the input character. A failure less than token and an input character are stored for an input character in the encoded string if the input character has a binary representation less than a binary representation of the predicted character. Thus, binary order is preserved in the encoded string. With the binary order preserving compression technique, data may be sorted while the data are still compressed. Prefix bits compression and dynamic token generation are also disclosed.

10 Claims, 9 Drawing Sheets

METHODS AND APPARATUS FOR DATA COMPRESSION THAT PRESERVES ORDER BY USING FAILURE GREATER THAN AND FAILURE LESS THAN TOKENS

FIELD OF THE INVENTION

The present invention relates to the field of data compression, and more particularly to a data compression technique that preserves the order of the data when compressed.

BACKGROUND OF THE INVENTION

Generally, data compression is used in systems to reduce the amount of storage space required to store the data or to reduce the amount of bandwidth required to transmit the data. Various data compression techniques are known in the prior art. For example, hash-based predictive compression is used to compress character strings of natural language text. Hash-based predictive compression utilizes the fact that the knowledge of a short substring of characters constitutes a good basis for predicting the next character in the character string. This method for predicting successive characters based on a preceding substring is feasible because the order of characters in a natural language is not random.

In general, the hash based predictive compression technique gathers the information of short substrings of characters, and predicts the next character in the sequence based on the substring. For a correct prediction, the compression technique does not store the corresponding correctly predicted character. Instead, an indication is stored to reflect that the character was predicted correctly. However, by eliminating the storage of some characters and adding indications as to whether the character is stored, the binary representation of the characters no longer exhibits the original binary order. For example, the letter "B" has a binary representation greater than the binary representation of the letter "A." However, when encoded, the letter "B" may have a binary representation less than the binary representation of the letter "A."

An example data processing system, which utilizes data compression, may compress the data, store or transmit the data, and decompress the data prior to processing. In such a system, data are not processed in the compressed form because characteristics of the data required for processing are concealed completely when the data are compressed. The requirement that data be decompressed prior to processing results in slower and less efficient processing than would occur if the data could be processed in the compressed form. Clearly, for many data processing systems, a benefit may be realized by reducing the amount of data required for processing to increase the performance. For example, in a merge-sort data processing application, the application utilizes a storage device to temporarily hold portions of the data during processing. For such an application, multiple accesses to the mass storage device may be required particularly when processing large amounts of data. The I/O accesses to the mass storage device are often the bottleneck in the performance of the data processing application. Consequently, it is desirable to reduce the amount of data required to reduce I/O accesses in a data processing application, thereby increasing performance.

As is described below, the present invention includes a compression technique that preserves binary order of character strings when compressed. Because order of the compressed character strings is preserved, data processing may occur directly on the compressed data to provide an improvement in data processing performance.

SUMMARY OF THE INVENTION

A plurality of characters in a character string are input to a compressor. The compressor encodes the input character string to generate an encoded string. The encoding preserves the original binary order of the character strings in the encoded strings. A predicted character is generated for each character based on prior character sequences in the character string. In one embodiment, a hash based predictive technique is used to generate the predicted characters. A correct order indicating token is generated for an input character if a predicted character, corresponding to the input character, is the input character. The compressor encodes the order indicating token in the encoded string to represent the character. However, if an input character has a binary representation greater than a binary representation of a corresponding predicted character, then a failure greater than token and the input character are encoded to represent the input character. A failure less than token and an input character are encoded for an input character if the input character has a binary representation less than a binary representation of the predicted character. When an input character is stored with a token, the tokens are appended in the most significant bit location so that the correct order indicating token, the failure greater than token, and the failure less than token preserves the original binary order of the character string.

In one embodiment, a correct predicted token equals a binary "10", a failure greater than token equals a binary "11", and a failure less than token equals a binary "0". In another embodiment, additional prefix bits may be eliminated. Specifically, one or more significant bits of an input character are eliminated from the encoded string if the one or more significant bits of a corresponding predicted character are set to zero, and if the input character has a binary representation less than a binary representation of the corresponding predicted character. Also, one or more significant bits of an input character are eliminated from the encoded string if the one or more significant bits of a corresponding predicted character are set to one, and if the input character has a binary representation greater than a binary representation of the corresponding predicted character.

In another embodiment, prefix bits are eliminated and a dynamic token is generated. For this embodiment, a binary "10" token is generated for the input character if a most significant bit of a corresponding predicted character is not set to zero and if the input character has a binary representation equal to a binary representation of the corresponding predicted character. A binary "01" token is generated for the input character if a most significant bit of a corresponding predicted character is set to zero, and if the input character has a binary representation equal to a binary representation of the corresponding predicted character. A binary "1" token and an input character is generated for the input character if the input character has a binary representation greater than a binary representation of a corresponding predicted character. Finally, a binary "0" token and an input character is generated for the input character if the input character has a binary representation less than a binary representation of a corresponding predicted character.

With the binary order preserving compression techniques of the present invention, data may be sorted while the data are still compressed.

Other features and advantages of the present invention will be apparent from the accompanying drawings, and from the detailed description that follows below.

BRIEF DESCRIPTION OF THE DRAWINGS

The features and advantages of the present invention will be apparent from the following detailed description of the preferred embodiment of the invention with references to the following drawings.

DETAILED DESCRIPTION

Figure 1A:
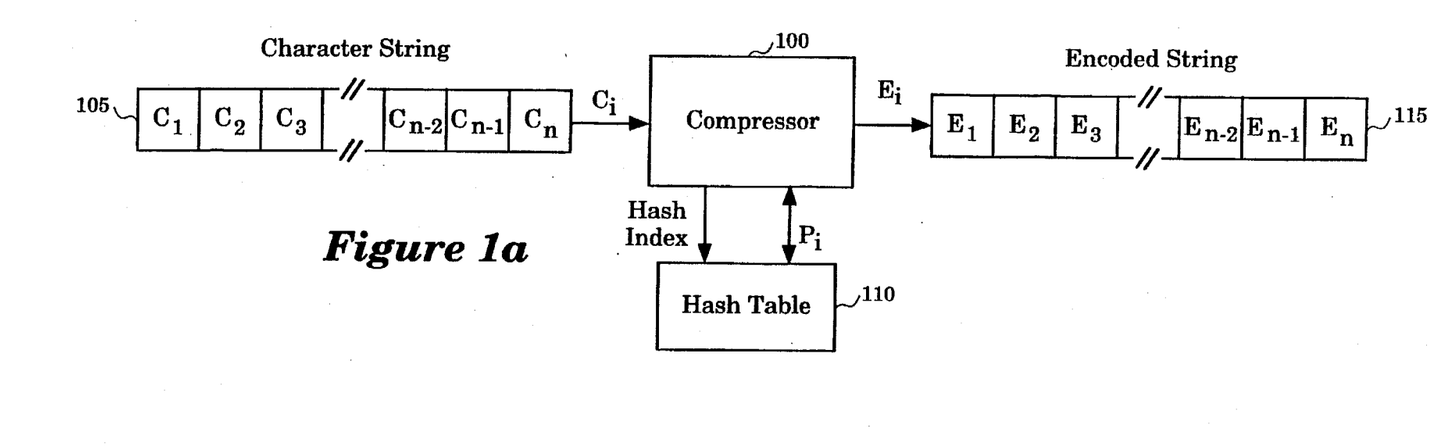
FIG. 1a is a block diagram illustrating a data compression system.

BINARY ORDER PRESERVING COMPRESSION:

FIG. 1a is a block diagram illustrating a data compression system. A compressor 100 receives, as an input, a character string 105. The character string 105, as shown in FIG. 1a, contains a plurality of characters $C_1$-$C_n$. The characters $C_1$-$C_n$, stored in the character string 105, contain a binary representation in accordance with a character encoding scheme. The character string 105 may contain binary representations in accordance with any character code, such as an ASCII code, an eight bit EBCDIC code, or a six bit internal code. For each of these character codes, the characters are assigned binary representations in an ascending order such that the binary representation for the character "B" is a larger number than the binary representation for the character "A", and the binary representation for the character "C" is a larger number than the binary representation for the character "B." For example, in a 7 bit ASCII code, the character "A" is "100 0001", the character "B" is "100 0010", and the character "C" is "100 0011." The compressor 100 generates, as an output, an encoded string 115. In general, the encoded string 115 contains a plurality of tokens and characters, labeled $E_1$-$E_n$ on FIG 1a. As is explained more fully below, the encoded string 115 contains tokens that preserve binary order among the characters in the character string 105.

The compressor 100 is coupled to a hash table 110. The hash table 110 contains a plurality of entries that store predicted characters. The predicted characters correspond to a successor character in a given substring of characters. The compressor 100 generates a hash index and receives a predicted character from the hash table identified by the hash index. The hash index is derived from a hash function. In general, a hash based predictive compression technique utilizes statistical information about a character string to derive the entries in the hash table.

The present invention is described in conjunction with a hash based predictive compression technique that utilizes a given hash table; however, any method used to generate the predicted values for the hash based predictive compression technique may be used in conjunction with the present invention without deviating from the spirit and scope of the present invention.

The binary order preserving data compression technique of the present invention is described in conjunction with a specific hash-based predictive compression algorithm. The hash based predictive compression technique disclosed may be used in conjunction with the present invention to encode a character string or textual data. However, this hash based predictive compression technique is merely exemplary, and any hash based algorithm may be used in conjunction with the binary order preserving techniques disclosed herein without deviating from the spirit and scope of the invention.

Given an input character string, such as character string 105 ($C_1$-$C_n$) a substring ($C_1$-$C_i$) may be defined such that "i" is less than "n." In addition, a block length "k" is defined, wherein the block length "k" specifies the number of characters in a substring that are used to predict a successive character. In one embodiment, k, which is always less than i, equals "3" characters. Based on the substring ($C_1$-$C_i$) and block length k, a prediction substring, entitled PS, is defined by the relationship:

$$PS = (C_{(i-k)} - C_{(i-1)})$$

The prediction substring, PS, is used to identify the substring of characters that predict the next successive character, $C_i$, by predicting that the next successive character ($C_i$) is the same as for the previous occurrence of PS. For purposes of nomenclature, the predicted character is defined as $P_i$. Using this nomenclature, if $C_i$, which is the current input character to the compressor 100, is the same as the successor of the previous occurrence of the substring PS, which is $P_i$, then a proper prediction is generated.

The hash table 110 (FIG. 1a) is utilized to store the predicted successors, or the predicted character $P_i$ for the input character $C_i$. If the predictive substring (PS), which is used for predicting the next successive character, has not occurred before, then there is no basis to determine the next character. Therefore, an initial "k" characters are stored without any prediction (e.g. without performing a hash table look-up). For each character (i) from (k to n−1), the predicted character $P_i$ is stored in a hash table entry. The hash table entry is indexed by a hash function, wherein the hash function defines location of the predictive substring such that:

$$H((C_{(i-k)} - D_{(i-1)}))$$

where h is the hash function. The hash table stores the k parameter block size as well for future reference during decompression.

Figure 2:
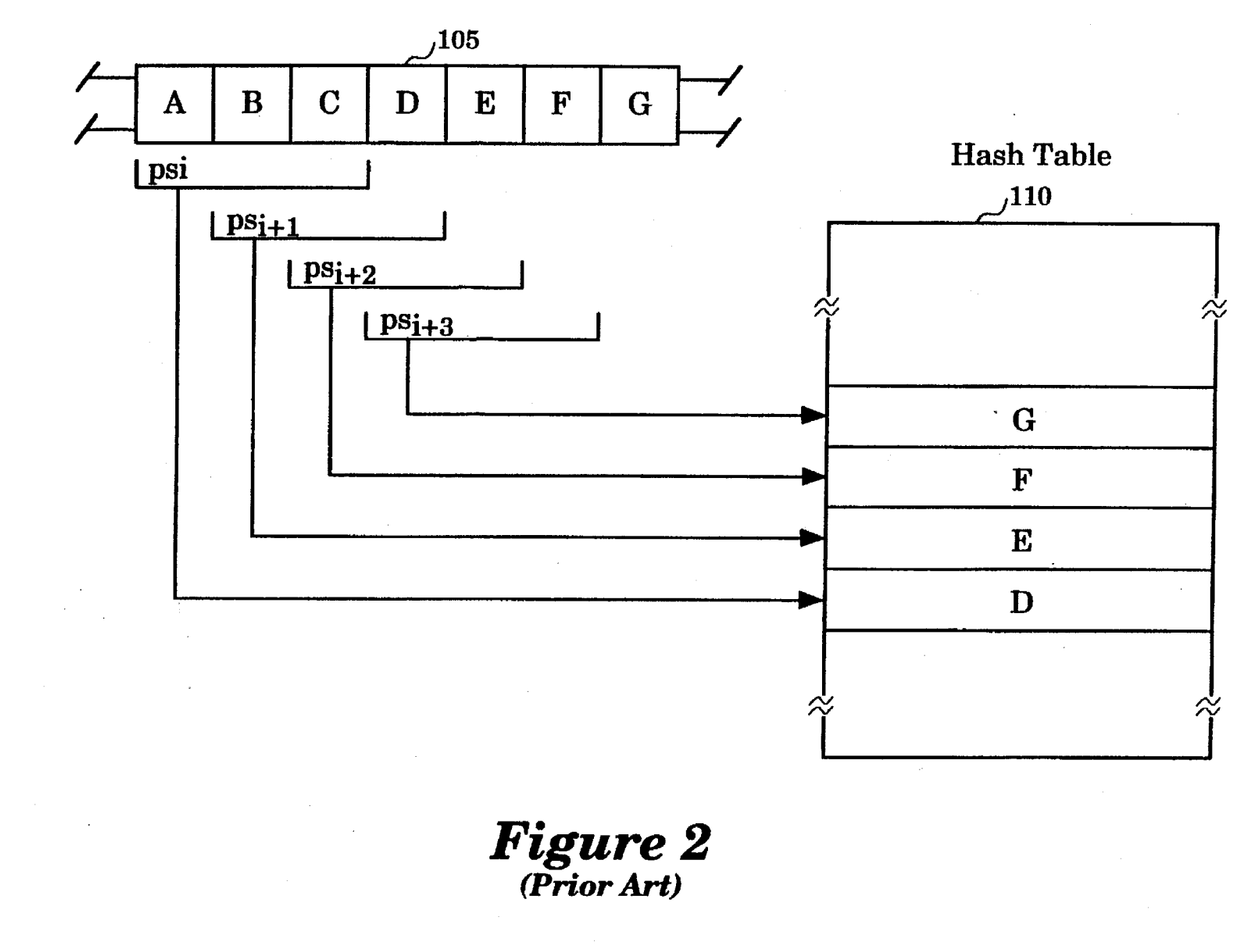
FIG. 2 illustrates a mapping of predictive substrings from an input character string to a hash table.

FIG. 2 conceptually illustrates a mapping of predictive substrings, PS, from the character string 105 into the hash table 110. As shown by the lines and arrows in FIG. 2, for each predictive substring (PS), a hash index, specified by a hash function, maps the (PS) into an entry in the hash table 110. For the example shown in FIG. 2, the predictive substring ($PS_i$) containing the characters "ABC" maps into a hash table entry for storage of the successive character "D." Similarly, for the additional substrings ($PS_{i+1}$, $PS_{i+2}$, and $PS_{i+3}$), each predictive substring maps into the hash table 110. These examples assume that the natural language indications properly predict the successive character. The order of the characters in hash table 110 is merely exemplary, and the actual storage of characters is based on the hash function. Any hash based predictive function may be used in conjunction with the present invention to map the predictive substrings into the entries of hash table 110. In one embodiment, a remainder of division technique is used. The remainder of division technique is defined by the function $$h(key)=key \text{ MOD } M$$

where the devisor M determines the effective size of the hash table and is a prime number. The key is defined as the predictive substring. The remainder of division hash function works well when the block size is relatively small, such as when the block size is 3.

Figure 3:
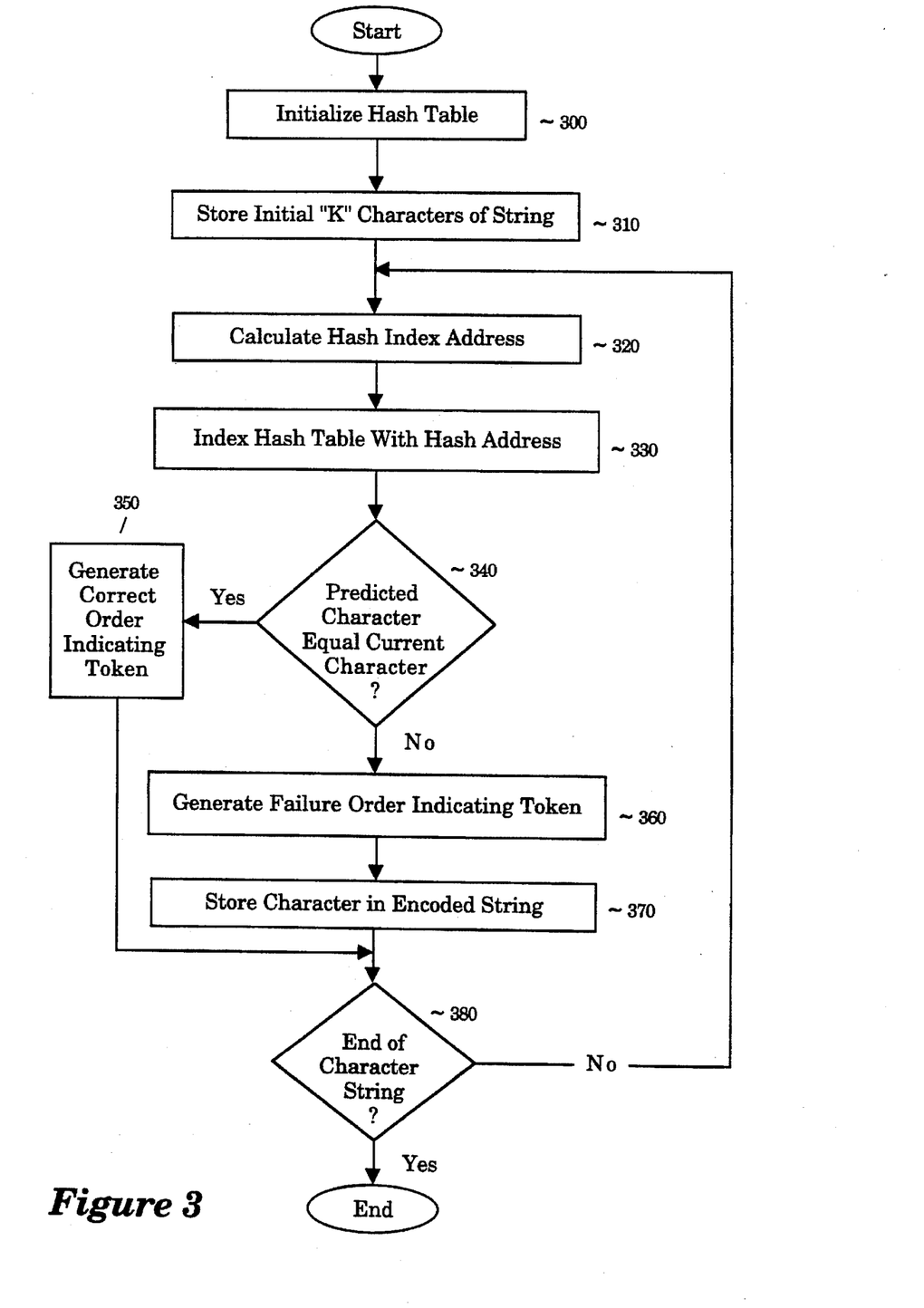
FIG. 3 is a flow diagram illustrating one embodiment of hash based predictive compression that preserves binary order.

FIG. 3 is a flow diagram illustrating one embodiment of hash based predictive compression that preserves binary order. In block 300, the hash table 110 is initialized to a given state. As shown in block 310, an initial block of characters for the character string are stored in the encoded string 115 (e.g. the first "k" characters). For all subsequent characters, ($C_i$+k+1), the compressor 100 calculates a hash index or hash address based on the hash function used as shown in block 320. With the hash address, the hash table 110 is indexed to retrieve the predicted character ($P_i$). A comparison is made between the current character ($C_i$) and the predicted character ($P_i$) to determine whether the current character, $C_i$, is equal to the predicted character, $P_i$, as shown in block 340. If not, the compressor 100 generates a failure order indicating token depending upon whether the binary representation of the predicted character is greater or less than the binary representation of the current character as shown in block 360. The failure order indicating token and the current character, Ci, are stored in the encoded string 115 in the "i" location. The failure order indicating token, appended to the beginning of the character, Ci, preserves binary order relative to the predicted character. If the predicted character is the same as the current character, then the compressor 100 generates a correct order indicating token that preserves binary order relative to the greater than or less than token as shown in block 350. If the next character in the input character string 105 is not the end of the character string, then the compressor 100 processes the next character Ci in accordance with blocks 320, 330, 340, 350, 360, and 370.

Figure 1B:
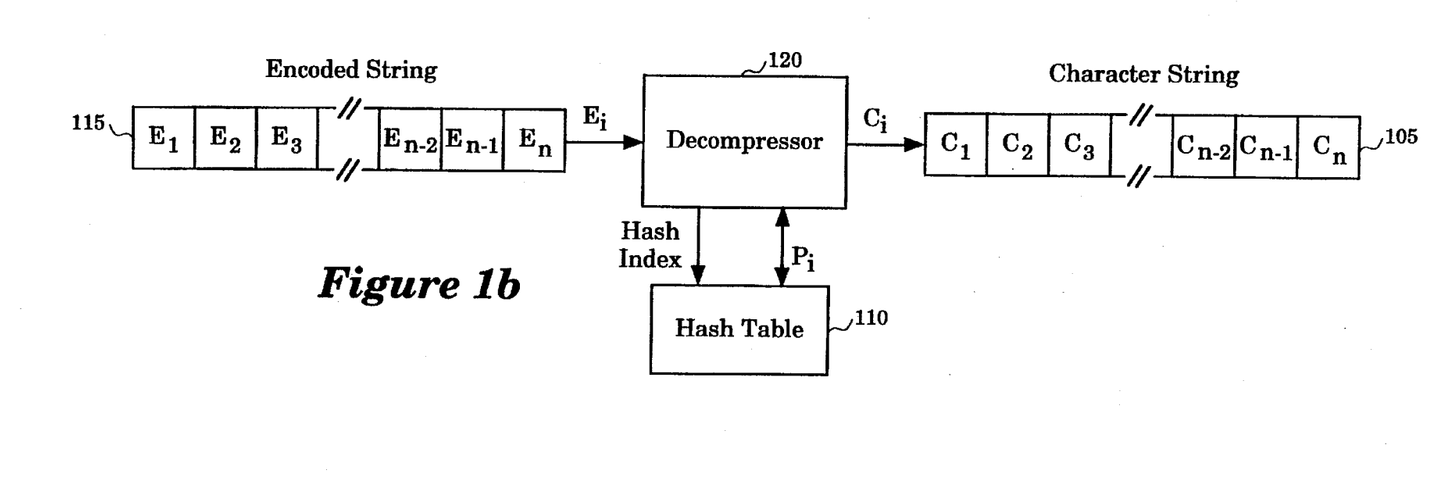
FIG. 1b is a block diagram illustrating one embodiment of data decompression.
Figure 4:
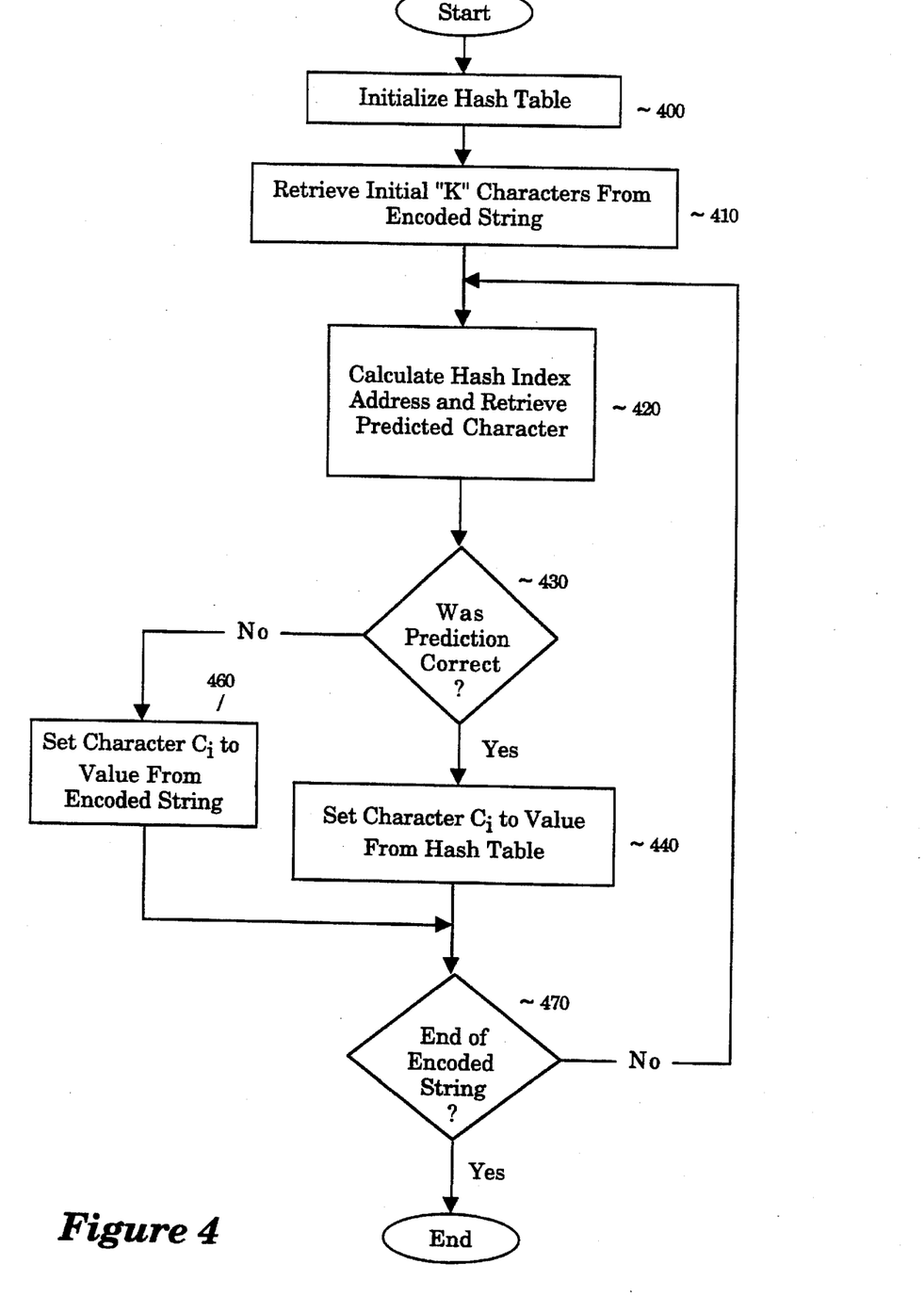
FIG. 4 is a flow diagram illustrating one embodiment for decompressing an encoded string.

FIG. 1b is a block diagram illustrating one embodiment of decompression. A decompressor 120 receives, as input, the encoded string 115, and generates, as an output, the character string 105. As shown in FIG. 1b, the decompressor 120 is coupled to the hash table 110 such that the decompressor 120 accesses the hash table 110 with the hash index to receive a predicted character. FIG. 4 is a flow diagram illustrating one embodiment for decompressing the encoded string. The hash table 110 is initialized to the same state as it was initialized for compression as shown in block 400. As shown in block 410, the decompressor 120 retrieves the initial "k" characters from the encoded string 115, and places these characters at the beginning of the character string 105.

The decompressor 120 processes each entry in the encoded string 115 (i.e. each token and corresponding character, if any). The hash index or address is calculated from the hash function, and is utilized to retrieve the predicted character for the corresponding input from the encoded string as shown in block 420. The decompressor 120 reads the token, and if the token is a correct order indicating token, then the character string entry, $C_i$, is set to the predicted character $P_i$ as shown in block 440. If the character was improperly predicted, then the decompressor 120 sets the character $C_i$ to the value contained in the encoded string 115 as shown in block 450. As shown in FIG. 4, for each input $E_i$, the decompressor 120 executes blocks 430, 440, and 450.

Figure 5:
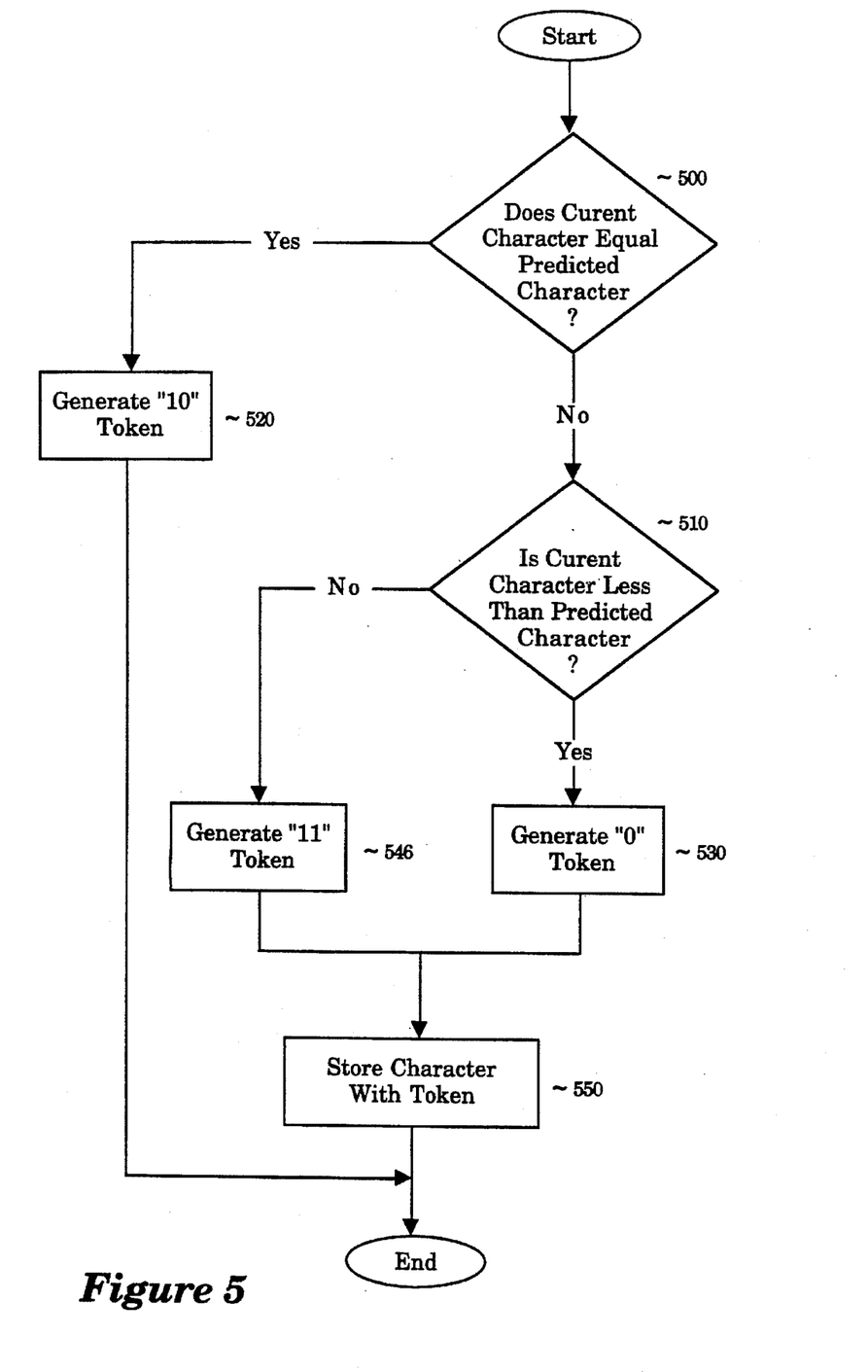
FIG. 5 is a flow diagram illustrating one embodiment for generating order preserving tokens.

FIG. 5 is a flow diagram illustrating one embodiment for generating order preserving tokens. As shown in block 500 of FIG. 5, the compressor 100 determines whether the current character $C_i$ equals the predicted character $P_i$. If so, the compressor 100 generates the token "10", in binary, for the encoded output $E_i$. If the current character is not equal to the predicted character, then the compressor 100 determines whether the binary representation of the current character $C_i$ is less than the binary representation of the predicted character $P_i$ as shown in decision block 510. If the current character $C_i$ is less than the predicted character $P_i$, then the compressor 100 generates the token "0", in binary, as shown in block 530. If the current character $C_i$ is greater than the predicted character Pi, then the compressor 100 generates the token "11", in binary, as shown in block 540. When a failure order indicating token is generated, the output $E_i$ for the corresponding input character contains the character $C_i$ as shown in block 550.

The compression technique of the present invention preserves binary order among encoded strings. For example, let P equal the current predicted character, $C_i$ equal the input character, and the input characters exhibit a binary order such that ($C_1 < C_2 < C_3 < C_4 < C_5$). For this example, if $C_3$ equals the current predicted character P, then the compressor 100 generates the following output:

$t_1 = 0\{C_1\}$
$t_2 = 0\{C_2\}$
$t_3 = 10$
$t_4 = 11\{C_4\}$
$t_5 = 11\{C_5\}$

Note that the output tokens and stored characters have a comparison order such that ($E_1 < E_2 < E_3 < E_4 < E_5$). Therefore, a comparison order of the original characters $C_1 - C_5$ is the same as the comparison order of the encoded output $E_1 - E_5$ as bit strings when their predicted characters are the same.

Figure 6:
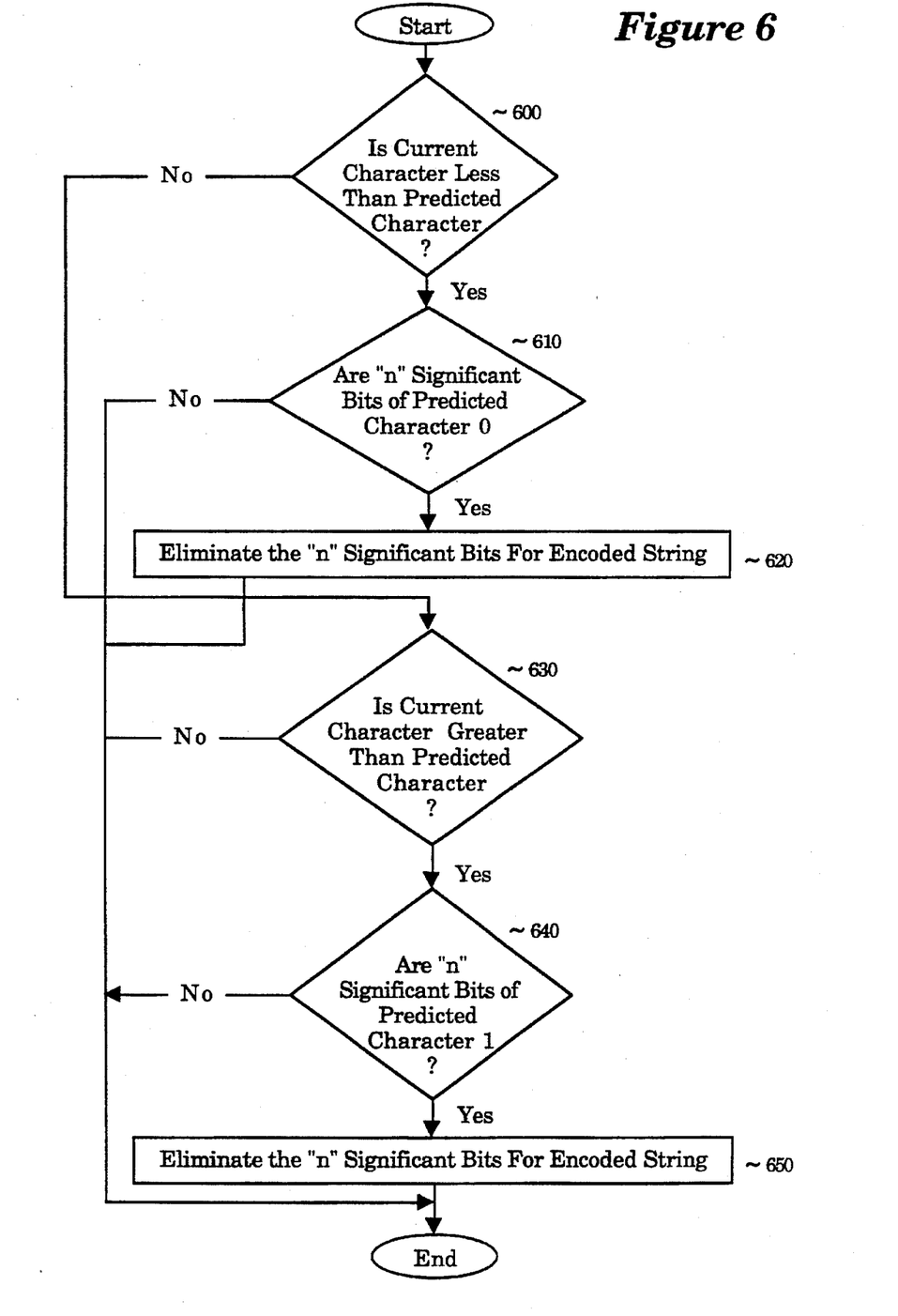
FIG. 6 is a flow diagram illustrating one embodiment for compressing prefix bits when using a hash based predictive compression technique that preserves binary order.

PREFIX BITS COMPRESSION AND DYNAMIC TOKEN GENERATION:

FIG. 6 is a flow diagram illustrating one embodiment for compressing prefix bits when using a hash based predictive compression technique that preserves binary order. In general, the prefix bits compression technique reduces the number of bits contained in the encoded string. The bits that are eliminated provide redundant information in terms of the binary order. Therefore, the order of the binary representation of the encoded characters remains preserved. As shown in blocks 600, 610 and 620, if the current character is less than the predicted character, and the predicted character contains "n" zeros in the most significant bit position, then the "n" most significant bits in the current character are eliminated for output to the encoded string. The "n" most significant bits may comprise one or more bits. As shown in blocks 600, 630, and 640, if the current character is greater than the predicted character, and there are "n" most significant bits equal to "1" in the predicted character, then the "n" most significant bits in the current character are eliminated for storage in the encoded string. Again, the "n" most significant bits may comprise one or more bits. Through use of prefix bits compression, a reduction of bits in the encoded string is obtained without sacrificing loss of binary order.

Figure 7:
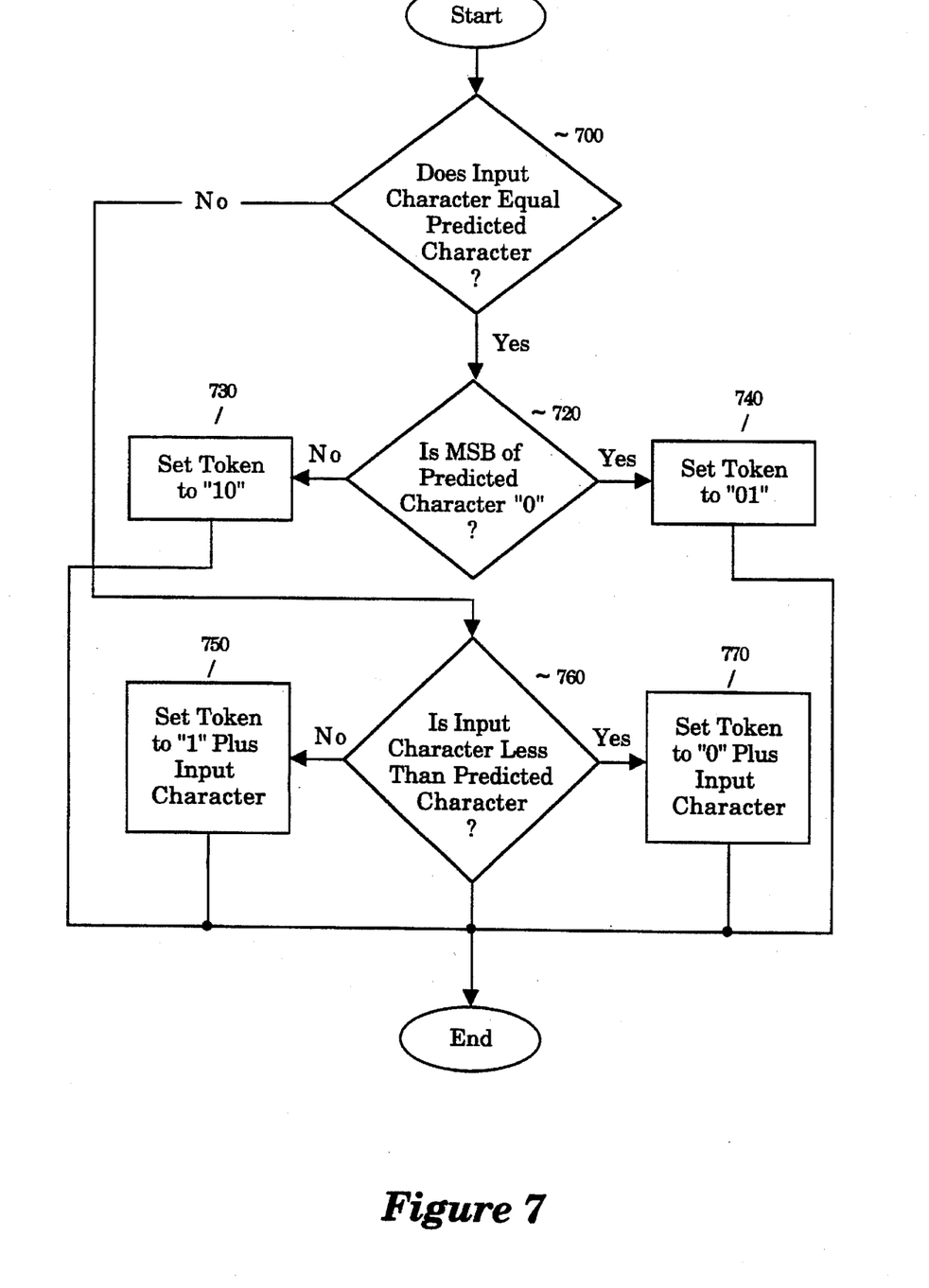
FIG. 7 is a flow diagram illustrating a second embodiment for generating tokens that preserve binary order.

FIG. 7 is a flow diagram illustrating a second embodiment for generating tokens that preserve binary order. The second embodiment may be entitled dynamic token generation because the value of the tokens assigned is based on the predicted characters. The dynamic token generation method also includes prefix bits compression to assign tokens for the encoded string. As shown in blocks 700, 720 and 740 in FIG. 7, if the input character equals the predicted character, and the most significant bit of the predicted character is "0", then a "01" token is generated. If the input character equals the predicted character, but the most significant bit of the predicted character is not a "0", then the correct indicating token is set to "10" as shown in blocks 700, 720, and 730. If the input character is less than the predicted character, then the token is set to "0" as shown in blocks 700, 760, and 770. In addition, the input character is stored with the "0" token. Finally, if the input character is greater than the predicted character, then the token is set to "1" as shown in block 700, 760, and 750. Also, the input character is stored with the "1" token.

MERGE—SORT APPLICATION:

The order preserving compression technique of the present invention has application for use in merge-sort operations. In general, the merge-sort operation is a data processing operation used to sort large amounts of records or data. When manipulating large amounts of data, the merge-sort algorithm utilizes storage space, such as a disk drive space, to temporarily store data records during processing. Therefore, for such an operation, large amounts of input/output (I/O) operations are required. However, if the data are compressed, then the merge-sort technique requires fewer I/O accesses due to the smaller record sizes.

Figure 8:
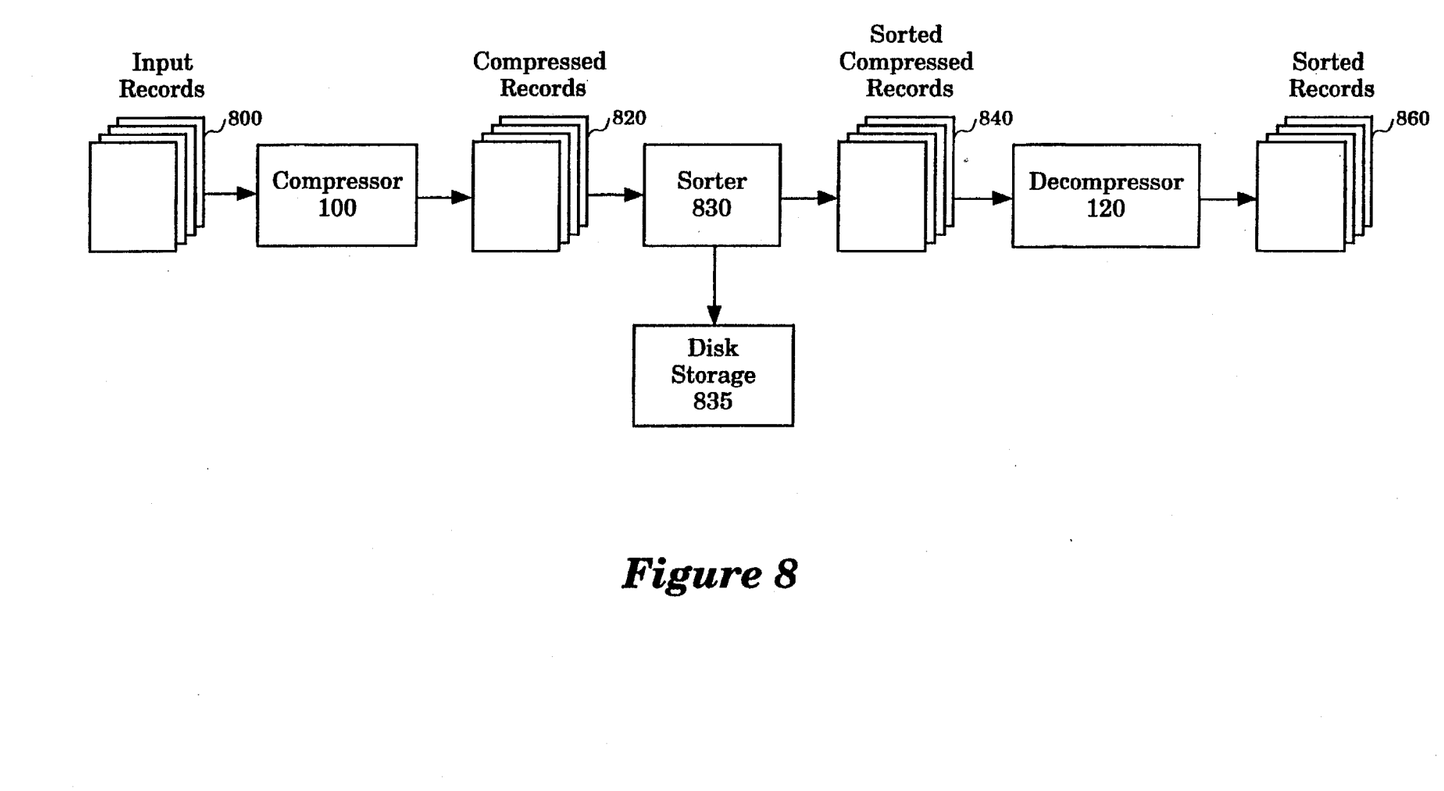
FIG. 8 is a block diagram illustrating a merge-sort operation incorporating the binary order preserving compression of the present invention.

FIG. 8 is a block diagram illustrating a merge-sort operation incorporating the binary order preserving compression of the present invention. Input records 800, that include textual data, are input to the compressor 100. The compressor 100 compresses the input records 800 preserving the order of the records as described above. The output of the compressor 100 is the compressed records 820, and the compressed records 820 are input to a sorter 830. The sorter 830 executes a merge-sort operation on the compressed records 820. Because the compressor 100 retains the binary comparison order in the compressed records 820, the operation of the sorter 830 on compressed records 820 is equal to the sorting operation executed on uncompressed records (e.g. the sort result of the input records 800 is the same as the sort result of the compressed records 820). Because of this, there is no need to modify the sort algorithm executed in the sorter 830. The sorter 830 is intended to represent a general class of devices or processes for sorting data that are well known in the art.

As shown in FIG. 8, the sorter 830 is coupled to a disk storage 835. The disk storage 835 is used to temporarily store data during execution of the sort/merge operation. As discussed above, access to the disk storage 835 is slow enough to result in a bottleneck for execution of the sort-merge algorithm. The output of the sorter 830 is the sorted compressed records 840. The sorted compressed records 840 are input to the decompressor 120 for decompression. The output is shown as the sorted records 860 in FIG. 8. Consequently, the binary order preserving compression technique of the present invention results in a enhanced merge-sort operation.

Figure 9:
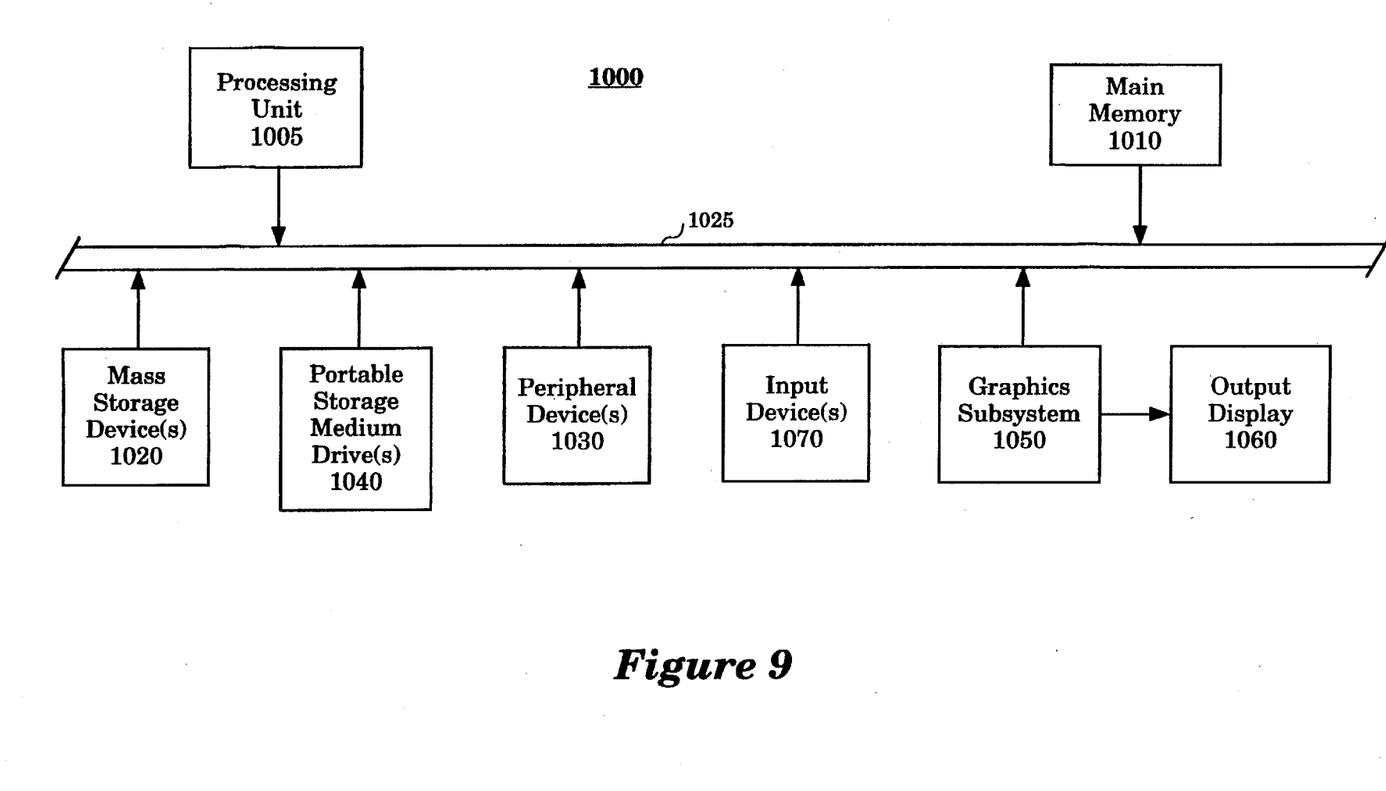
FIG. 9 illustrates a high level block diagram of a general purpose computer system in which the compression system of the present invention may be implemented.

COMPUTER SYSTEM:

FIG. 9 illustrates a high level block diagram of a general purpose computer system in which the compression system of the present invention may be implemented. A computer system 1000 contains a processor unit 1005, main memory 1010, and an interconnect bus 1025. The processor unit 1005 may contain a single microprocessor, or may contain a plurality of microprocessors for configuring the computer system 1000 as a multi-processor system. The main memory 1010 stores, in part, instructions and data for execution by the processor unit 1005. If the content processing system of the present invention is wholly or partially implemented in software, the main memory 1010 stores the executable code when in operation. The main memory 1010 may include banks of dynamic random access memory (DRAM) as well as high speed cache memory.

The computer system 1000 further includes a mass storage device 1020, peripheral device(s) 1030, portable storage medium drive(s) 1040, input control device(s) 1070, a graphics subsystem 1050, and an output display 1060. For purposes of simplicity, all components in the computer system 1000 are shown in FIG. 9 as being connected via the bus 1025. However, the computer system 1025 may be connected through one or more data transport means. For example, the processor unit 1005 and the main memory 1010 may be connected via a local microprocessor bus, and the mass storage device 1020, peripheral device(s) 1030, portable storage medium drive(s) 1040, graphics subsystem 1050 may be connected via one or more input/output (I/O) busses. The mass storage device 1020, which may implemented with a magnetic disk drive or an optical disk drive, is a non-volatile storage device for storing data and instructions for use by the processor unit 1005. In one embodiment, the mass storage device 1020 stores the compression software for loading to the main memory 1010.

The portable storage medium drive 1040 operates in conjunction with a portable non-volatile storage medium, such as a floppy disk or a compact disc read only memory (CD-ROM), to input and output encoded data and code to and from the computer system 1000. In one embodiment, the compression software is stored on such a portable medium, and is input to the computer system 1000 via the portable storage medium drive 1040. The peripheral device(s) 1030 may include any type of computer support device, such as an input/output (I/O) interface, to add additional functionality to the computer system 1000. For example, the peripheral device(s) 1030 may include a network interface card for interfacing the computer system 1000 to a network. For the software implementation, the character string 105 may be input to the computer system 1000 via a portable storage medium or a network for processing by the computer.

The input control device(s) 1070 provide a portion of the user interface for a user of the computer system 1000. The input control device(s) 1070 may include an alphanumeric keypad for inputting alphanumeric and other key information, and a cursor control device, such as a mouse, a trackball, stylus, or cursor direction keys. In order to display textual and graphical information, the computer system 1000 contains the graphics subsystem 1050 and the out-put display 1060. The output display 1060 may include a cathode ray tube (CRT) display or liquid crystal display (LCD). The graphics subsystem 1050 receives textual and graphical information, and processes the information for output to the output display 1060. The components contained in the computer system 1000 are those typically found in general purpose computer systems, and in fact, these components are intended to represent a broad category of such computer components that are well known in the art.

The compression system may be implemented in either hardware or software. For the software implementation, the compression system is software that includes a plurality of computer executable instructions for implementation on a general purpose computer system, such as computer system 1000. Prior to loading into a general purpose computer system, the compression software may reside as encoded information on a computer readable medium, such as a magnetic floppy disk, magnetic tape, and compact disc read only memory (CD - ROM). In one hardware implementation, the compression system may comprise a dedicated processor including processor instructions for performing the functions described herein. Circuits may also be developed to perform the functions described herein.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A method for compressing a plurality of characters in a character string, said method comprising the steps of:

generating a predicted character for each of said characters in said character string based on prior character sequences in said character string;

encoding a correct order indicating token for an input character if a predicted character, corresponding to said input character, is said input character;

encoding, for an input character, a failure greater than token and said input character if said input character has a binary representation greater than a binary representation of a corresponding predicted character; and encoding, for an input character, a failure less than token and said input character if said input character has a binary representation less than a binary representation of said predicted character, wherein said correct order indicating token, said failure greater than token, and said failure less than token result in preserving binary order of said .character string.

2. The method as set forth in claim 1, wherein:

said correct predicted token equals a binary 1,0;

said failure greater than token equals a binary 1,1; and said failure less than token equals a binary 0.

3. The method as set forth in claim 1, further comprising the steps of:

eliminating one or more significant bits of an input character if said one or more significant bits of a corresponding predicted character are set to zero and if said input character has a binary representation less than a binary representation of said corresponding predicted character; and eliminating one or more significant bits of an input character if said one or more significant bits of a corresponding predicted character are set to one and if said input character has a binary representation greater than a binary representation of said corresponding predicted character.

4. A method for compressing a plurality of characters in a character string, said method comprising the steps of:

generating a predicted character for each of said characters in said character string based on prior character sequences in said character string;

encoding a binary "10" token for said input character if a most significant bit of a corresponding predicted character is not set to zero and if said input character has a binary representation equal to a binary representation of said corresponding predicted character;

encoding a binary "01" token for said input character if a most significant bit of a corresponding predicted character is set to zero and if said input character has a binary representation equal to a binary representation of said corresponding predicted character;

encoding a binary "1" token and an input character for said, input character if said input character has a binary representation greater than a binary representation of a corresponding predicted character; and encoding a binary "0" token and an input character for said input character if said input character has a binary representation less than a binary representation of a corresponding predicted character.

5. A method for sorting a plurality of records comprising a plurality of characters, said method comprising the steps of:

generating a plurality of compressed records from said records including the steps of:

generating a predicted character for each of said characters in said records based on prior character sequences in said records;

encoding a correct order indicating token for an input character if a predicted character, corresponding to said input character, is said input character;

encoding a failure greater than token and said input character for said input character if said input character has a binary representation greater than a binary representation of a corresponding predicted character;

encoding a failure less than token and said input character for said input character if said input character has a binary representation less than a binary representation of said predicted character, wherein said correct order indicating token, said failure greater than token, and said failure less than token result in preserving binary order of said records; and sorting said compressed records.

6. A computer readable medium comprising a plurality of program instructions for:

generating a predicted character for each of said characters in said character string based on prior character sequences in said character string;

encoding a correct order indicating token for an input character if a predicted character, corresponding to said input character, is said input character;

encoding, for an input character, a failure greater than token and said input character if said input character has a binary representation greater than a binary representation of a corresponding predicted character; and encoding, for an input character, a failure less than token and said input character if said input character has a binary representation less than a binary representation of said predicted character, wherein said correct order indicating token, said failure greater than token, and said failure less than token result in preserving binary order of said character string.

7. The computer readable medium as set forth in claim 6, wherein:

said correctly predicted token equals a binary 1,0;

said greater than token equals a binary 1,1; and said less than token equals a binary 0.

8. The computer readable medium as set forth in claim 6, comprising further program instructions for:

eliminating one or more significant bits of an input character if said one or more significant bits of a corresponding predicted character are set to zero and if said input character has a binary representation less than a binary representation of said corresponding predicted character; and eliminating one or more significant bits of an input character if said one or more significant bits of a corresponding predicted character are set to one and if said input character has a binary representation greater than a binary representation of said corresponding predicted character.

9. A computer readable medium comprising a plurality of program instructions for:

generating a predicted character for each of said characters in said character string based on prior character sequences in said character string;

encoding a binary "10" token for said input character if a most significant bit of a corresponding predicted character is not set to zero and if said input character has a binary representation equal to a binary representation of said corresponding predicted character;

encoding a binary "01" token for said input character if a most significant bit of a corresponding predicted character is set to zero and if said input character has a binary representation equal to a binary representation of said corresponding predicted character;

encoding a binary "1" token and an input character for said input character if said input character has a binary representation greater than a binary representation of a corresponding predicted character; and encoding a binary "0" token and an input character for said input character if said input character has a binary representation less than a binary representation of a corresponding predicted character.

10. A computer system comprising:

a processing unit;

a storage device coupled to said processor unit for storing records;

main memory, coupled to said processor unit, for storing a plurality of instructions for execution in said processor unit, said instructions for generating a plurality of compressed records from said records including instructions for:

generating a predicted character for each of said characters in said records based on prior character sequences in said records;

encoding a correct order indicating token for an input character if a predicted character, corresponding to said input character, is said input character;

encoding a failure greater than token and said input character for said input character if said input character has a binary representation greater than a binary representation of a corresponding predicted character;

encoding a failure less than token and said input character for said input character if said input character has a binary representation less than a binary representation of said predicted character, wherein said correct order indicating token, said failure greater than token, and said failure less than token result in preserving binary order of said records; and sorting said compressed records that comprise a plurality of characters including utilizing said storage device for temporary storage.

\* \* \* \* \*